(12) United States Patent
Masuko (10) Patent No.: US 9,472,467 B2
(45) Date of Patent: Oct. 18, 2016

(54) MANUFACTURING METHOD OF SEMICONDUCTOR DEVICE

(71) Applicant: KABUSHIKI KAISHA TOSHIBA, Tokyo (JP)

(72) Inventor: Shingo Masuko, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 14/636,642

(22) Filed: Mar. 3, 2015

(65) Prior Publication Data

US 2016/0079123 A1    Mar. 17, 2016

(30) Foreign Application Priority Data

Sep. 11, 2014    (JP) .................. 2014-185632

(51) Int. Cl.
| | |
|---|---|
| H01L 21/00 | (2006.01) |
| H01L 21/8252 | (2006.01) |
| H01L 21/304 | (2006.01) |
| H01L 21/306 | (2006.01) |
| H01L 21/3065 | (2006.01) |
| H01L 21/768 | (2006.01) |
| H01L 29/778 | (2006.01) |
| H01L 29/20 | (2006.01) |

(52) U.S. Cl.
CPC ......... *H01L 21/8252* (2013.01); *H01L 21/304* (2013.01); *H01L 21/3065* (2013.01); *H01L 21/30612* (2013.01); *H01L 21/30625* (2013.01); *H01L 21/768* (2013.01); *H01L 29/7783* (2013.01); *H01L 29/2003* (2013.01)

(58) Field of Classification Search
CPC ............. H01L 21/8252; H01L 21/304; H01L 21/30612; H01L 21/30625; H01L 21/3065; H01L 21/768
See application file for complete search history.

(56) References Cited

U.S. PATENT DOCUMENTS

| | | | |
|---|---|---|---|
| 6,866,560 B1* | 3/2005 | Follstaedt | B24B 37/042 438/692 |
| 2008/0230780 A1* | 9/2008 | Urashima | H01L 21/0237 257/51 |

FOREIGN PATENT DOCUMENTS

JP    2012-160515 A    8/2012

* cited by examiner

*Primary Examiner* — Richard Booth
(74) *Attorney, Agent, or Firm* — Patterson & Sheridan, LLP (57) ABSTRACT

A method of forming a semiconductor device including a semiconductor substrate having a first surface and a second surface, and having a gallium nitride-containing layer provided on the first surface of the semiconductor substrate includes grinding, polishing, and etching the second surface of the semiconductor substrate of which a thickness is d1, and reducing the thickness of the semiconductor substrate to one-fifth or less of d1.

20 Claims, 9 Drawing Sheets

MANUFACTURING METHOD OF SEMICONDUCTOR DEVICE

CROSS-REFERENCE TO RELATED APPLICATION

This application is based upon and claims the benefit of priority from Japanese Patent Application No. 2014-185632, filed Sep. 11, 2014, the entire contents of which are incorporated herein by reference.

FIELD

Embodiments described herein relate generally to a manufacturing method of a semiconductor device.

BACKGROUND

A gallium nitride based semiconductor device in which a semiconductor substrate on which the gallium nitride based device is formed is thinned to, in part, miniaturize the device and effect better heat transfer out of the device. Thinning of the semiconductor substrate is performed, for example, by backside grinding thereof, i.e., grinding away a surface of the substrate opposed to the side where the device is formed.

However, where a silicon substrate is used as the substrate on which a gallium nitride based device is formed, the resulting device has inherent stress due to the mismatch of the lattice constant of the silicon crystal and the lattice constant of the gallium nitride crystal. When performing backside grinding of the semiconductor substrate in such a situation, the silicon substrate may become excessively bent as a result of heat generated during the backside grinding. When the bending is excessive, the silicon substrate may break or fracture.

DESCRIPTION OF THE DRAWINGS

FIGS. 3A and 3B are schematic views illustrating a manufacturing process of the semiconductor device according to the embodiment.

FIGS. 4A and 4B are schematic views illustrating a manufacturing process of the semiconductor device according to the embodiment.

FIGS. 5A and 5B are schematic views illustrating a manufacturing process of the semiconductor device according to the embodiment.

FIGS. 6A and 6B are schematic views illustrating a manufacturing process of the semiconductor device according to the embodiment.

FIGS. 7A and 7B are schematic views illustrating a manufacturing process of the semiconductor device according to the embodiment.

FIGS. 8A and 8B are schematic views illustrating a manufacturing process of the semiconductor device according to the embodiment.

DETAILED DESCRIPTION

Embodiments provide a manufacturing method of a semiconductor device in which bending of a semiconductor substrate is prevented.

In general, according to one embodiment, a method of forming a semiconductor device including a semiconductor substrate having a first surface and a second surface, and having a gallium nitride-containing layer provided on the first surface of the semiconductor substrate includes grinding, polishing, and etching the second surface of the semiconductor substrate of which a thickness is dl, and reducing the thickness of the semiconductor substrate to one-fifth or less of dl.

Hereinafter, an embodiment will be described with reference to the drawings. In the following description, the same reference numerals are given to the same members and description will be omitted appropriately regarding a member described already.

Figure 1:
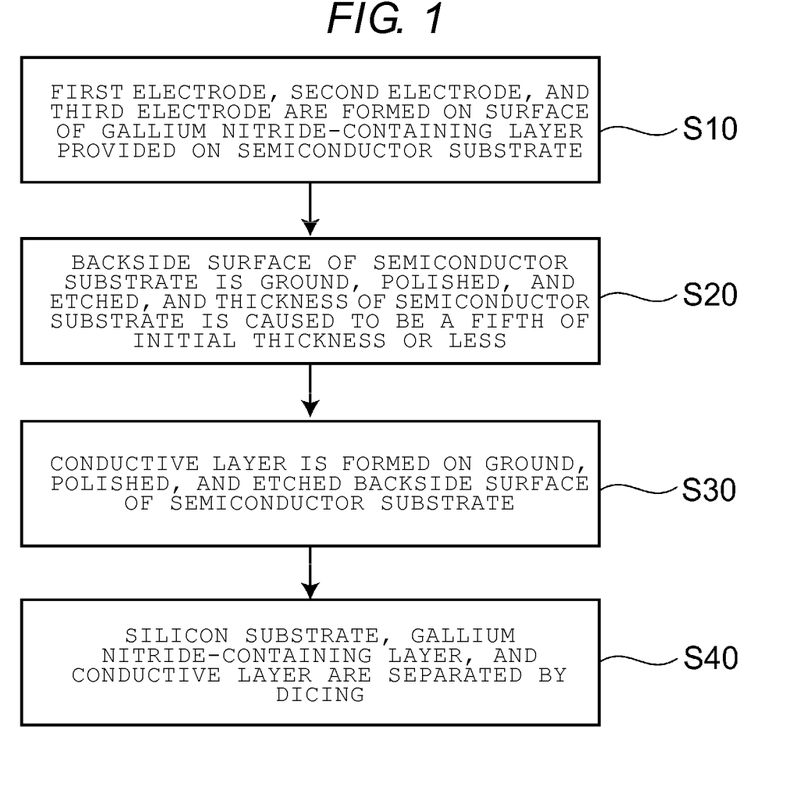
FIG. 1 is a flowchart illustrating a manufacturing method of a semiconductor device according to an embodiment.

FIG. 1 is a flowchart illustrating a manufacturing method of a semiconductor device according to the embodiment.

For example, a first electrode, a second electrode, and a third electrode are formed on a surface of a gallium nitride-containing layer provided on a semiconductor substrate (step S10). Here, the semiconductor substrate is a silicon substrate. As an example, the first to third electrodes correspondingly connect to a source, a drain, and a gate of a high electron mobility transistor, respectively. Furthermore, the embodiment is not limited to the high electron mobility transistor and the electrodes may connect to a source, a drain, and a gate of a MOSFET.

Next, a backside surface of the semiconductor substrate is ground, polished, and etched, and the thickness of the semiconductor substrate is caused to be one-fifth or less of its original thickness during the forming of the gallium nitride layer(s) and electrode(s) thereon (step S20).

Next, a conductive layer is formed on the ground, polished and etched backside surface of the semiconductor substrate (step S30).

Next, the semiconductor substrate, the gallium nitride-containing layer, and the conductive layer are diced into individual devices (step S40).

Hereinafter, the steps set forth in the flowchart of FIG. 1 will be described in further detail.

First, before describing a manufacturing process of the semiconductor device according to the embodiment, a processing machine for grinding or polishing the semiconductor substrate will be described.

Figure 2:
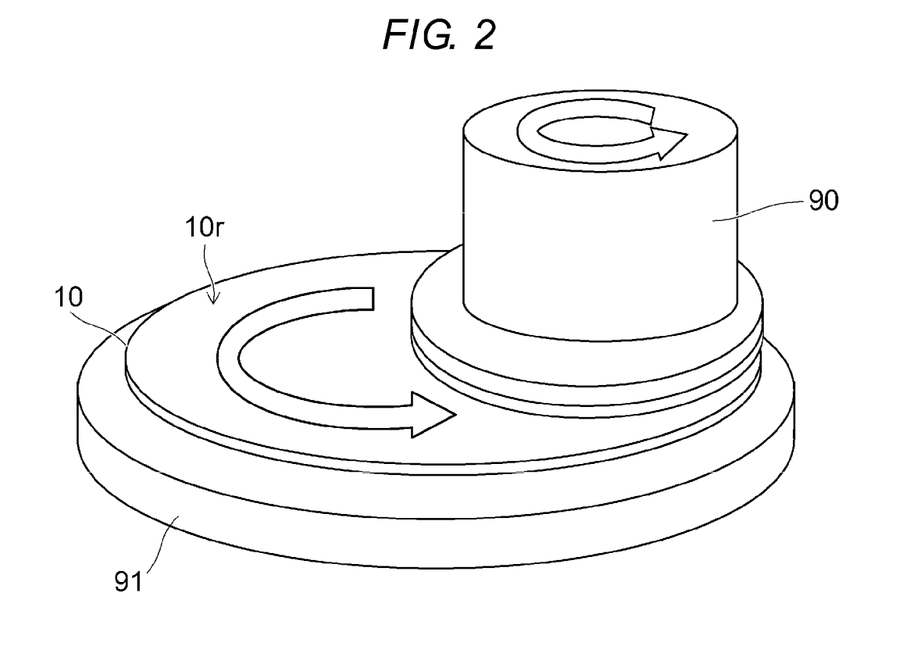
FIG. 2 is a schematic perspective view illustrating a main portion of a processing machine for grinding or polishing a semiconductor substrate according to the embodiment.

FIG. 2 is a schematic perspective view illustrating a main portion of the processing machine for grinding or polishing the semiconductor substrate according to the embodiment.

As illustrated in FIG. 2, on a processing machine 90 for grinding (backside grinding (B.G.)) or polishing (polishing grinding (P.G.)) a polishing surface 10r thereof is pressed against the rear (backside) surface of a semiconductor substrate 10 mounted on a grinding table 91. One or both of the processing machine 90 or the semiconductor substrate 10 may be rotated in the direction of the arrows shown in FIG. 2.

The processing machine 90 does not cover an entire surface of the semiconductor substrate 10 and, for example, a diameter of the processing machine 90 is set to the radius dimension, or more, of the semiconductor substrate 10. Abrasive grains such as diamond grit or grains are interposed between the processing machine 90 and the semiconductor substrate 10, and the backside surface 10r of the semiconductor substrate 10 is ground or polished by the diamond grit moving over the backside surface of the substrate as a result of the rotation of one or both of the processing machine 90 or the semiconductor substrate 10 by virtue of rotation of the table 91 to which it is mounted.

Here, the removal rate of the semiconductor substrate 10 material by grinding is higher than a removal rate of the semiconductor substrate 10 material by polishing. Furthermore, an average grain diameter of the abrasive grains used for polishing is smaller than an average grain diameter of abrasive grains used for grinding. In other words, a polishing step is a so-called finishing process of the substrate after the backside grinding thereof.

A manufacturing process of the semiconductor device according to the embodiment will now be described.

FIGS. 3A to 7B are schematic views illustrating the manufacturing process of the semiconductor device according to the embodiment, each of FIGS. 3A, 4A, 5A, 6A, and 7A is a schematic plan view illustrating a backside surface of the semiconductor substrate, and each of FIGS. 3B, 4B, 5B, 6B, and 7B is a schematic cross-sectional view taken along each of lines IIIB, IVB, VB, VIB, and VIIB of each of FIGS. 3A, 4A, 5A, 6A, and 7A.

Figure 3A:
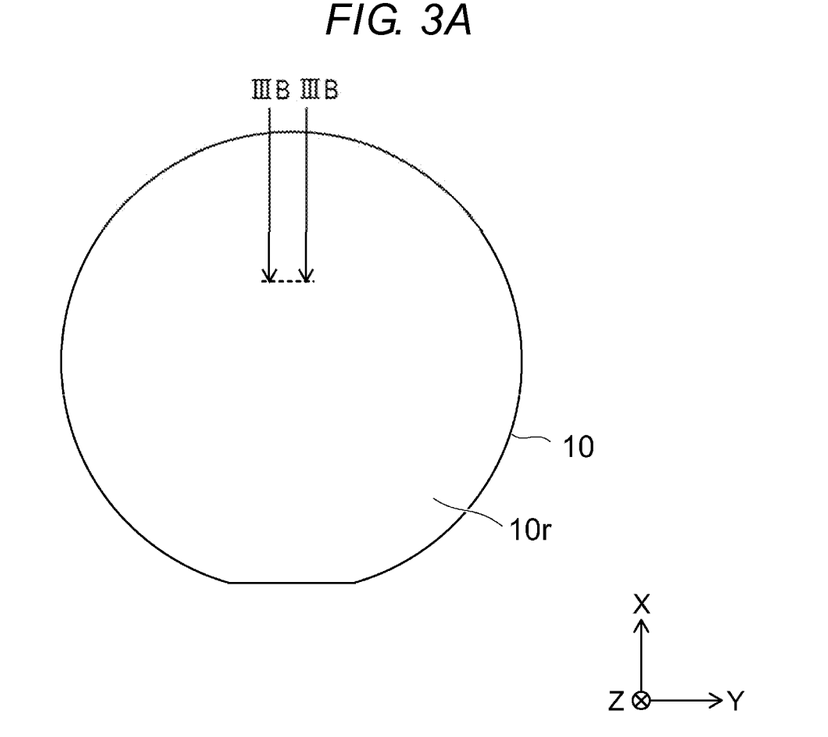
FIG. 3A is a schematic plan view illustrating a backside surface of the semiconductor substrate.
Figure 3B:
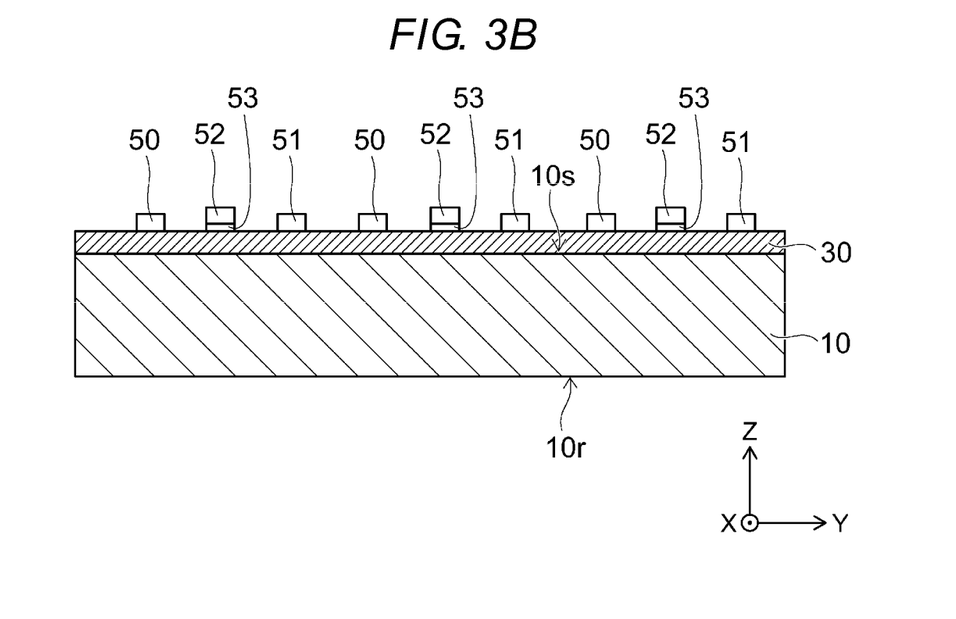
FIG. 3B is a schematic cross-sectional view that is taken along line IIIB-IIIB of FIG. 3A.

For example, as illustrated in FIGS. 3A and 3B, a gallium nitride-containing layer 30 is epitaxially growth on a front surface 10s of the semiconductor substrate 10 having a first surface (hereinafter, for example, referred to as the front surface 10s) and a second surface (hereinafter, referred to as the backside surface 10r). Here, the gallium nitride-containing layer 30 comprises a plurality of layers (described later). Furthermore, a thickness of the semiconductor substrate 10 in this stage is d1 for example, 1 mm). A thickness of the gallium nitride-containing layer 30 grown thereon is 10 μm.

Subsequently, a first electrode (hereinafter, for example, source electrode 50), a second electrode (hereinafter, for example, drain electrode 51), and a third electrode (hereinafter, for example, gate electrode 52) are formed on the gallium nitride-containing layer 30. Here, the drain and source electrodes may be formed directly on the gallium nitride containing layer 30, and the gate electrode 52 is disposed between the source electrode 50 and the drain electrode 51. A gate insulation film 53 is provided between the gate electrode 52 and the gallium nitride-containing layer 30. A plurality of sets of the source electrode 50, the drain electrode 51, and the gate electrode 52 are formed on the substrate.

After forming the source electrode 50, the drain electrode 51, and the gate electrode 52, a passivation film (not illustrated) may be formed to cover the semiconductor substrate 10 and a surface of the gallium nitride-containing layer 30 and the electrodes 51, 52 and 53. Furthermore, an electrode pad (not illustrated) electrically connected to each of the source electrode 50, the drain electrode 51, and the gate electrode 52 may be formed.

Figure 4A:
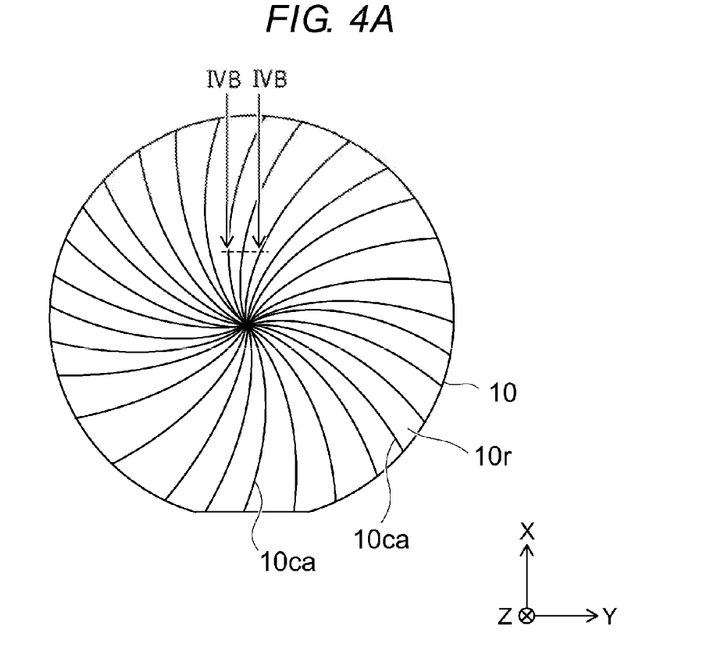
FIG. 4A is a schematic plan view illustrating a backside surface of the semiconductor substrate.
Figure 4B:
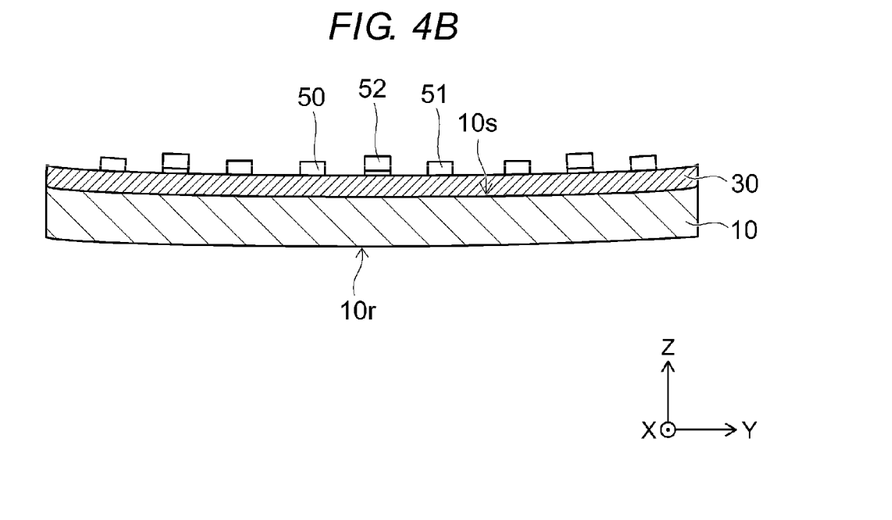
FIG. 4B is a schematic cross-sectional view that is taken along line IVB-IVB of FIG. 4A.

Next, as illustrated in FIGS. 4A and 4B, the backside surface 10r of the semiconductor substrate 10 is ground using the processing machine 90.

The grinding is performed by using abrasive grains (for example, diamond abrasive grains) of a grain size of #1500 of JIS (Japanese Industrial Standard), e.g., 9 to 15 μm. For example, the diamond abrasive grains (fixed abrasive grains) are fixed to a grinding surface of the processing machine 90 which contacts the backside surface 10r of the semiconductor substrate 10, and the backside surface 10r of the semiconductor substrate 10 is ground.

A liquid such as an oil, an organic liquid such as alcohol, or water may be interposed between the processing machine 90 and the semiconductor substrate 10 during the grinding of the backside 10r of the substrate. These liquids may have solvent properties with respect to silicon, to increase the rate at which the silicon of the substrate is removed therefrom. Otherwise, the grinding may be performed without using those liquids.

As a result of the grinding of the backside 10r of the semiconductor substrate 10, grinding traces 10ca are formed as damage or grooves on the backside surface 10r of the semiconductor substrate 10 in a rotation direction of the processing machine 90. When the grinding traces 10ca are formed in the semiconductor substrate 10, a portion of the stress intrinsic in the semiconductor substrate 10 in at least partly as a result of the lattice mismatch of the silicon of the substrate and the gallium nitride layers thereover, is released and the semiconductor substrate 10 bends to relieve these stresses.

Here, if the degree (amount) of bending exceeds a certain degree, or limit, the semiconductor substrate 10 may break or fracture. Additionally, when the semiconductor substrate 10 into which the grinding traces 10ca have been formed is disposed in another processing device such as a film forming device, the semiconductor substrate 10 may be broken. Furthermore, even if the semiconductor substrate 10 is not broken, the flexural strength of a device using the semiconductor substrate 10 in which the grinding traces 10ca remain is lowered.

Thus, in the embodiment, a process for decreasing the grinding traces 10ca formed in the semiconductor substrate 10 is performed thereafter.

Figure 5A:
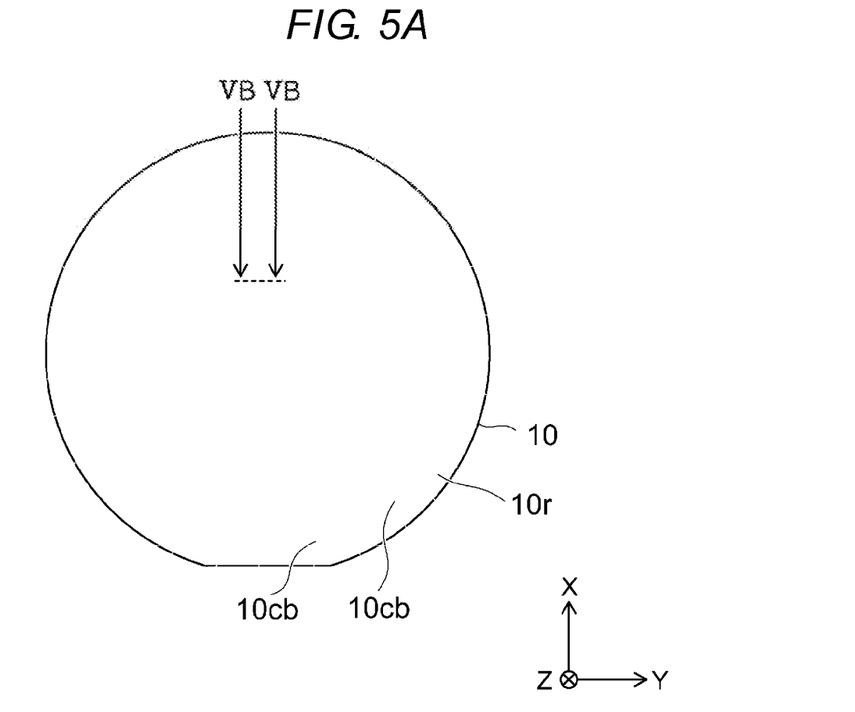
FIG. 5A is a schematic plan view illustrating a backside surface of the semiconductor substrate.
Figure 5B:
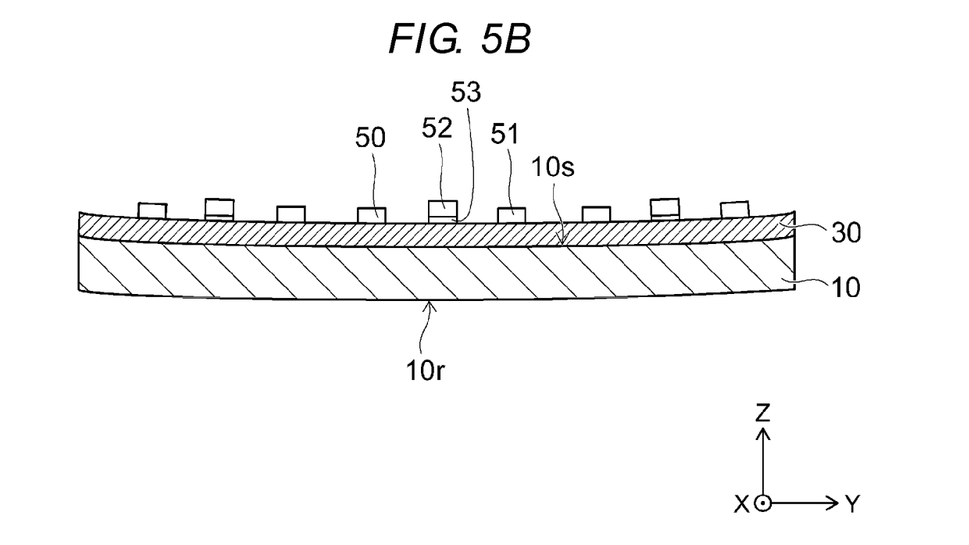
FIG. 5B is a schematic cross-sectional view that is taken along line VB-VB of FIG. 5A.

For example, as illustrated in FIGS. 5A and 5B, after the grinding step resulting in the traces 10ca, diamond abrasive grains finer than those during grinding are interposed between the processing machine 90 and the semiconductor substrate 10, and then the backside surface 10r of the semiconductor substrate 10 is further removed, now by polishing.

For example, the diamond abrasive grains are dispersed to the interface location of the backside surface of the polishing device and the backside surface 10r of the semiconductor substrate 10, and the backside surface 10r of the semiconductor substrate 10 is now polished. Alternatively, the substrate 10 may be moved to a chemical mechanical polishing apparatus, and the backside surface 10r of the semiconductor substrate 10 is then polished by a chemical mechanical polishing method (CMP).

During the polishing process, grinding traces 10cb having a depth shallower than the depth of the grinding traces 10ca remain in the backside surface 10r of the semiconductor substrate 10. As a result, the degree of the bending of the semiconductor substrate 10 is reduced, as compared to a case where the deeper grinding traces 10ca remain on the backside 10r of the semiconductor substrate.

Figure 6A:
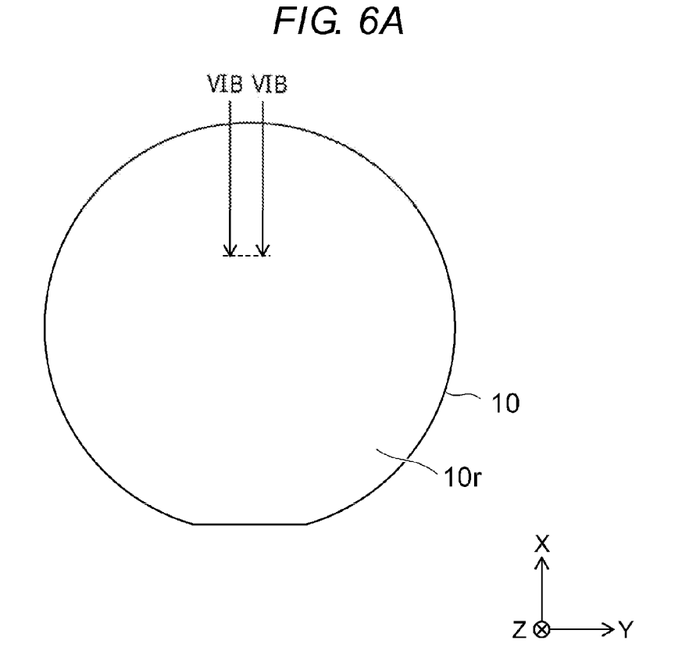
FIG. 6A is a schematic plan view illustrating a backside surface of the semiconductor substrate.
Figure 6B:
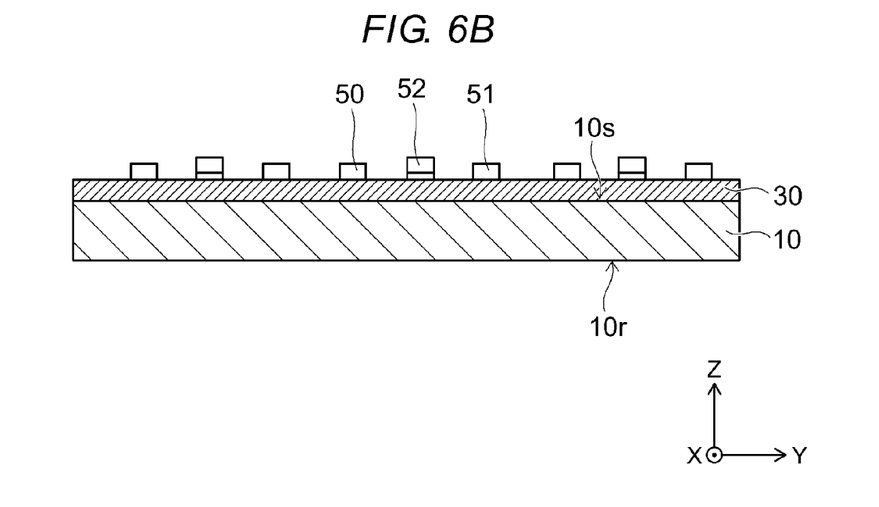
FIG. 6B is a schematic cross-sectional view that is taken along line VIB-VIB of FIG. 6A.

Next, the backside surface 10r of the semiconductor substrate 10 is etched, and the result of the etching is illustrated in FIGS. 6A and 6B. For example, the backside surface 10r of the semiconductor substrate 10 is dry-etched by gas containing at least one of carbon, sulfur, and fluoride.

Alternatively, the backside surface 10r of the semiconductor substrate 10 may be wet-etched by a liquid or vapor solution containing fluoride.

The depth of the grinding traces 10cb remaining in the backside surface 10r of the semiconductor substrate 10 is further decreased by the etching process. Furthermore, the degree of the bending of the semiconductor substrate 10 is reduced compared to a case where the grinding traces 10cb remain. That is, in the semiconductor substrate 10 according to the embodiment, the grinding traces are decreased and breakage of the semiconductor substrate 10 is unlikely to occur compared to a case of the semiconductor substrate 10 in which only the grinding process or grinding and polishing processes are performed and the grinding traces 10ca or 10cb remain in the backside 10r of the semiconductor substrate 10.

After completion of the processes of FIGS. 4A to 6B, the thickness of the semiconductor substrate 10 has a thickness of one-fifth or less of the initial thickness dl. For example, in the stage of processing illustrated in FIGS. 3A and 3B, if the thickness of the semiconductor substrate 10 is 1 mm, after completing the process of FIGS. 4A to 6B, the thickness of the semiconductor substrate 10 is 200 μm or less.

The thickness of the semiconductor substrate 10 is not limited to 200 μm or less upon completion of the process of FIGS. 4A to 6B.

For example, after completing the process of FIGS. 4A to 6B, the total thickness of the semiconductor substrate 10 and the gallium nitride-containing layer 30 is 50 μm or less per 1 inch of diameter of the semiconductor substrate. For example, when using the semiconductor substrate 10 of a diameter of 8 inches, after completing the process of FIGS. 4A to 6B, the total thickness of the semiconductor substrate 10 and the gallium nitride-containing layer 30 is 400 μm or less.

Alternatively, after completing the process of FIGS. 4A to 6B, the total thickness of the semiconductor substrate 10 and the gallium nitride-containing layer 30 is 25 μm or less per 1 inch of the diameter of the semiconductor substrate. For example, when using the semiconductor substrate 10 of a diameter of 8 inches, after completing the process of FIGS. 4A to 6B, the total thickness of the semiconductor substrate 10 and the gallium nitride-containing layer 30 is 200 μm or less.

Furthermore, after completing the process of FIGS. 4A to 6B, a surface roughness Ra of the backside surface 10r of the semiconductor substrate 10 is 0.006 μm or greater and 0.008 μm or less.

After completing the process of FIGS. 4A to 6B, when the semiconductor substrate 10 is mounted on a flat, i.e., flat planar, support stand (not illustrated), a difference between a height of the center of the semiconductor substrate 10 from the support stand and a height of an end of the semiconductor substrate 10 from the support stand is 150 μm or less.

Figure 7A:
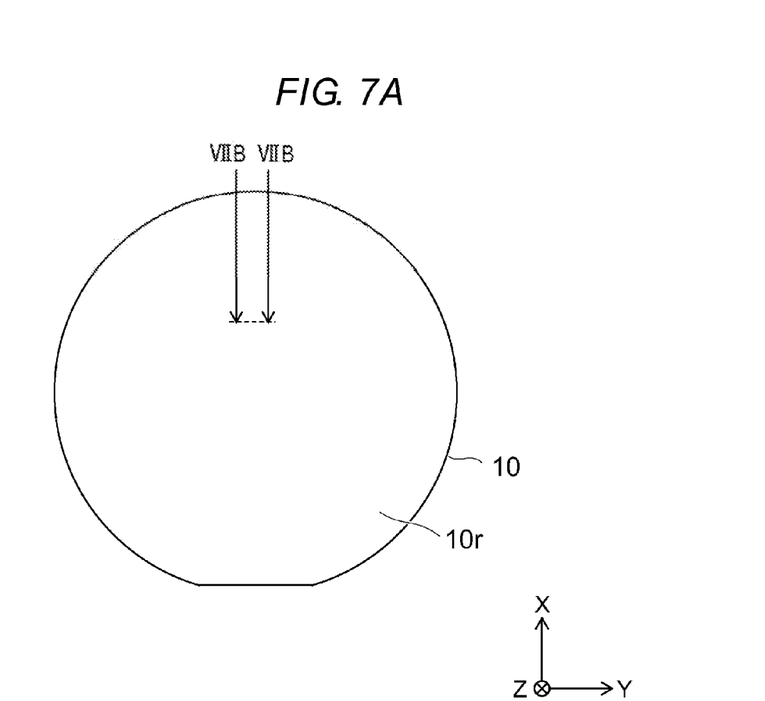
FIG. 7A is a schematic plan view illustrating a backside surface of the semiconductor substrate.
Figure 7B:
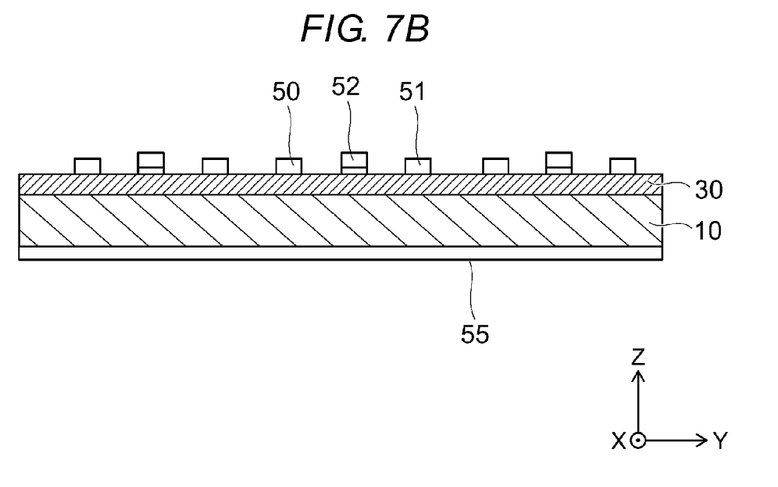
FIG. 7B is a schematic cross-sectional view that is taken along line VIIB-VIIB of FIG. 7A.

Next, as illustrated in FIGS. 7A and 7B, a conductive layer 55 is formed in the backside surface 10r of the semiconductor substrate 10. The conductive layer 55 is used as an electrode for soldering when mounting the semiconductor substrate 10 to a lead frame or the like. The conductive layer 55 may also, or additionally, provide a ground layer and a radiating body to stabilize a potential on the backside surface 10r side of the semiconductor substrate 10 and increase heat transfer therefrom.

Figure 8A:
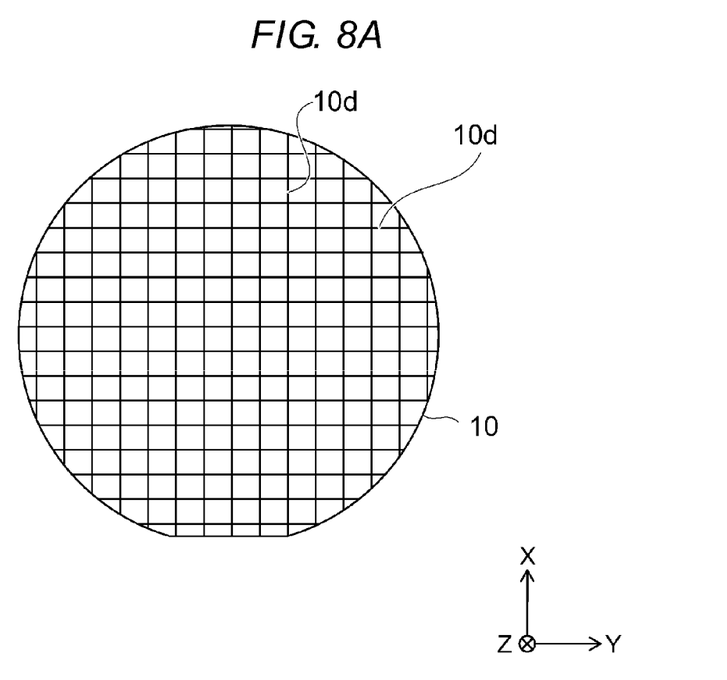
FIG. 8A is a schematic plan view illustrating a backside surface of the semiconductor substrate after singulation of individual devices therefrom.
Figure 8B:
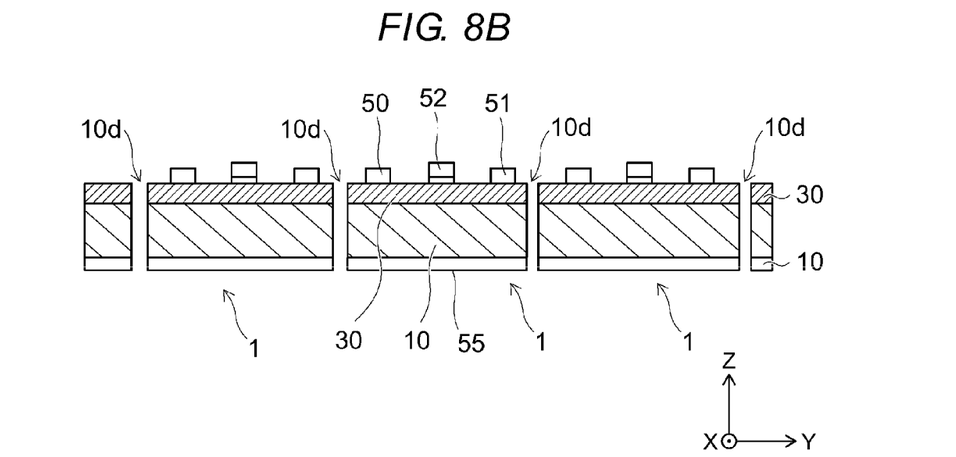
FIG. 8B is a schematic cross-sectional view illustrating the semiconductor device after individualization.

FIGS. 8A and 8B are schematic views illustrating a further manufacturing process of the semiconductor device according to the embodiment, FIG. 8A is a schematic plan view illustrating the backside surface of the semiconductor substrate after singulation of the semiconductor substrate 10 into individual die, and FIG. 8B is a schematic cross-sectional view illustrating the semiconductor device after singulation.

As illustrated in FIGS. 8A and 8B, the semiconductor substrate 10, the gallium nitride-containing layer 30, and the conductive layer 55 are cut through to singulate individual die, each die being a single semiconductor device and each resulting die including a source electrode 50, a drain electrode 51, and a gate electrode 52. For example, the semiconductor substrate 10, the gallium nitride-containing layer 30, and the conductive layer 55 are separated by a dicing process along a dicing line 10d. Thus, a plurality of individual semiconductor chips 1 is formed from the semiconductor substrate 10. Thereafter, packaging of the semiconductor chip 1 is performed by die bonding the chip 1 to a wiring substrate, wire bonding the contacts of the chip to the wiring on the wiring substrate, and applying sealing resin thereover to encapsulate the chip 1.

As described above, in the embodiment, the backside surface 10r of the semiconductor substrate 10 such as a silicon substrate supporting the gallium nitride-containing layer 30 is ground, polished, and etched. Thus, the grinding traces are reduced in the semiconductor substrate 10 and bending of the semiconductor substrate 10 is prevented. As a result, the semiconductor substrate 10 is unlikely to break.

Furthermore, in the embodiment, since the thickness of the semiconductor substrate 10 may be thin, thinning of the semiconductor chip 1 may be achieved. Thus, a thickness of the semiconductor package is also thin. Furthermore, since the thickness and/or presence of the grinding traces are decreased, the flexural strength of the semiconductor chip 1 is increased.

Figure 9:
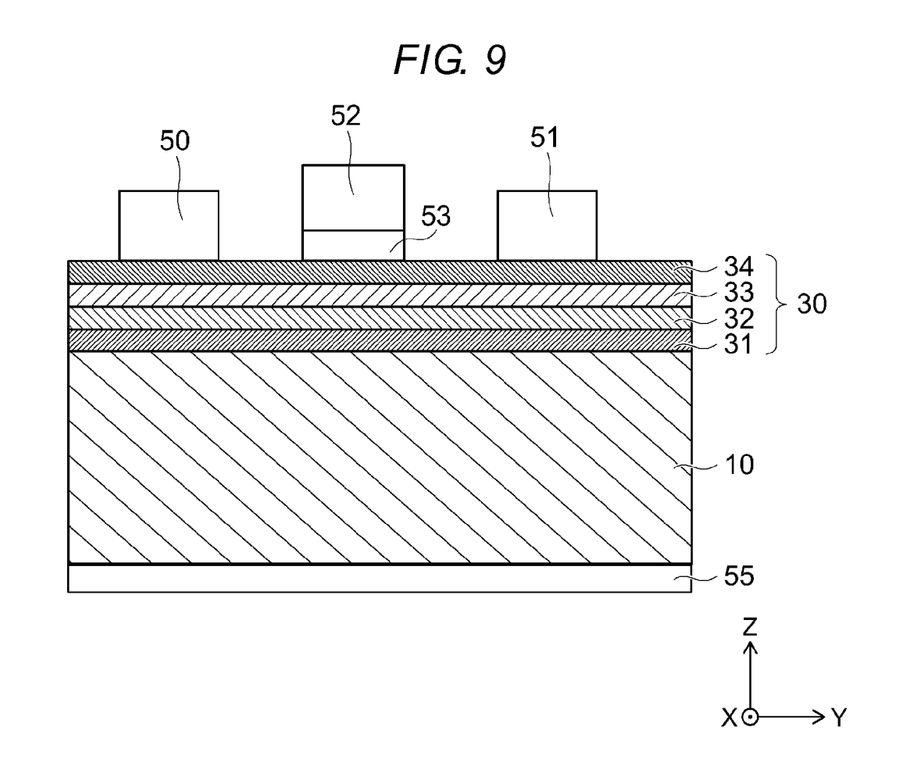
FIG. 9 is a schematic cross-sectional view illustrating a main portion of a semiconductor chip according to the embodiment.

FIG. 9 is a schematic cross-sectional view illustrating a main portion of the semiconductor chip according to the embodiment.

The semiconductor chip 1 illustrated in FIG. 9 includes the semiconductor substrate 10, the gallium nitride-containing layer 30 provided on the semiconductor substrate 10, the source electrode 50 provided on the gallium nitride-containing layer 30, the drain electrode 51 on the same gallium nitride containing layer 30 as the source electrode 50, the gate electrode 52 provided on a gate insulating layer on the gallium nitride containing layer 30 and located between the source electrode 50 and the drain electrode 51, and the conductive layer 55 provided on the backside 10r of the semiconductor substrate 10. The semiconductor chip 1 is configured as an HEMT device.

The gallium nitride-containing layer 30 includes an aluminum nitride-containing layer 31, an aluminum gallium nitride-containing layer 32, a gallium nitride-containing layer 33, and an aluminum gallium nitride-containing layer 34.

The source electrode 50 and the drain electrode 51 come into ohmic contact with the aluminum gallium nitride-containing layer 34. The gate insulation film 53 contains one of a silicon nitride film ($Si_3N_4$), a silicon oxide film ($SiO_2$), and aluminum oxide ($Al_2O_3$).

The aluminum nitride-containing layer 31 and the aluminum gallium nitride-containing layer 32 function as a buffer layer of the HEMT. The gallium nitride-containing layer 33 functions as a carrier generating layer of the HEMT. The aluminum gallium nitride-containing layer 34 functions as a barrier layer of the HEMT. The aluminum gallium nitride-containing layer 34 is an $Al_xGa_{1-x}N$ (0<X≤1) layer of non-doped type or an n-type. Secondary electrons are generated in the vicinity of interface in the gallium nitride-containing layer 33 between the gallium nitride-containing layer 33 and the aluminum gallium nitride-containing layer 34. Such a semiconductor chip 1 is also included in the embodiment.

Moreover, in this disclosure, "nitride semiconductor" collectively includes semiconductors of all compositions in which composition ratios x, y, and z are respectively changed within each range in a chemical formula of $B_xIn_yAl_zGa_{1-x-y-z}N$ (0≤x≤1, 0≤y≤1, 0≤z≤1, and x+y+z≤1). In addition, "the nitride semiconductor" also includes one further containing V group elements other than N (nitride), one further containing various elements added to control various physical properties such as a conductive type, and one further containing various elements which are unintentionally contained in the chemical formula described above.

In the embodiment described above, "on" in an expression that "a portion A is provided on a portion B" is used to mean a case where the portion A does not come into contact with the portion B and the portion A is provided above the portion B in addition to a case where the portion A comes into contact with the portion B and the portion A is provided on the portion B. Furthermore, "the portion A is provided on the portion B" may be applied to a case where the portion A and the portion B are reversed and the portion A is positioned below the portion B, or a case where the portion A and the portion B are horizontally disposed in the same line with each other. This is because the structure of the semiconductor device is not changed between before and after the rotation even if the semiconductor device according to the embodiment is rotated.

Hitherto, the embodiments are described with reference to the specific examples. However, the embodiments are not limited to the specific examples. That is, one in which those skilled in the art apply appropriate design changes to those specific examples is included in the range of the embodiments as long as it includes the characteristics of the embodiments. Each element included in the specific examples and, a disposition, a material, a condition, a shape, a size, and the like thereof are not limited to those which are illustrated above and may be appropriately changed.

Furthermore, each of the elements included the embodiment may be combined as long as it is technically possible and the combination is included in the range of the embodiment as long as each of the elements includes the characteristics of the embodiment. In addition, in a category of the spirit of the embodiments, those skilled in the art may derive various modified examples and corrected examples, and the modified examples and the corrected examples are understood to be also included in the range of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the invention.

What is claimed is:

1. A method of forming a semiconductor device including a semiconductor substrate having a first surface and a second surface, and having a gallium nitride-containing layer provided on the first surface of the semiconductor substrate, comprising:
   grinding, polishing, and etching the second surface of the semiconductor substrate of which a thickness is dl; and
   reducing the thickness of the semiconductor substrate to one-fifth or less of dl,
   wherein an amount of polishing is between ½ and ⅟₅₀ of an amount of grinding, and an amount of etching is between ⅟₂₀₀ and ⅟₅₀₀₀ of the amount of grinding.

2. The method according to claim 1,
   wherein a surface roughness Ra of the second surface of the semiconductor substrate after grinding, polishing, and etching the second surface of the semiconductor substrate is 0.006 μm or greater and 0.008 μm or less.

3. The method according to claim 1,
   wherein a total thickness of the semiconductor substrate after grinding, polishing, and etching the second surface of the semiconductor substrate and the gallium nitride-containing layer is 25 μm or less per 1 inch of a diameter of the semiconductor substrate.

4. The method according to claim 1,
   wherein after grinding, polishing, and etching the second surface of the semiconductor substrate, the semiconductor substrate is mounted on a planar support stand, and a difference between a height of a center of the semiconductor substrate from the support stand and a height of an end of the semiconductor substrate from the support stand is 150 μm or less.

5. The method according to claims 1,
   wherein the second surface of the semiconductor substrate is ground by fixed abrasive grains fixed to a grinding surface to grind the semiconductor substrate.

6. The method according to claim 5,
   wherein the grinding of the second surface of the semiconductor substrate with the fixed abrasive grains is performed without using a solvent.

7. The method according to claim 1,
   wherein the second surface of the semiconductor substrate is polished by disbursing the abrasive grains on the second surface.

8. The method according to claim 1,
   wherein the second surface of the semiconductor substrate is polished, after grinding thereof, by a chemical mechanical polishing method.

9. The method according to claim 8,
   wherein the second surface of the semiconductor substrate is etched by gas containing at least one of carbon, sulfur, and fluorine.

10. The method according to claim 1,
    wherein the second surface of the semiconductor substrate is etched by solution containing fluorine.

11. A method of forming a semiconductor device, comprising:
    providing a crystalline semiconductor substrate having a first crystal orientation;
    depositing, on a first side of the semiconductor substrate, a crystalline semiconductor layer having a second crystal orientation different from the first crystal orientation;

grinding away a portion of a second side, opposed to the first side, of the semiconductor substrate using a first abrasive of a first size, and thereby forming grinding traces extending inwardly of the second side of the semiconductor substrate; and polishing the second side of the semiconductor substrate after the grinding of the second side of the semiconductor substrate and reducing the depth of the grinding traces.

12. The method of claim 11, further comprising etching the second side of the substrate, after the polishing thereof, with a wet etchant.

13. The method of claim 11, further comprising etching the second side of the substrate, after the polishing thereof, with a gas phase etchant.

14. The method of claim 13, further comprising, after etching the second side of the semiconductor substrate, forming a conductive layer thereover.

15. The method of claim 11, wherein the semiconductor substrate comprises silicon.

16. The method of claim 11, wherein the crystalline semiconductor layer having a second crystal orientation different from the first orientation comprises gallium nitride.

17. The method of claim 16, wherein the crystalline semiconductor layer having the second crystal orientation different from the first orientation comprises a plurality of sub layers.

18. A method of manufacturing a semiconductor device, comprising:

forming a plurality of semiconductor devices comprising a semiconductor material of a first crystal orientation, and wiring layers connected thereto, on a semiconductor substrate having a second, different, crystal orientation;

grinding away a surface of the semiconductor substrate on which the plurality of semiconductor devices are not formed; and removing grooves cut inwardly of the semiconductor substrate during the grinding thereof to reduce the depth of the grooves.

19. The method of claim 18, wherein, as a result of the grinding away the surface of the semiconductor substrate on which the plurality of semiconductor devices are not formed, the thickness of the semiconductor substrate is reduced to no more than one-fifth of its thickness before the grinding occurred.

20. The method of claim 18, wherein the semiconductor substrate comprises silicon and the semiconductor material of the first crystal orientation comprises gallium nitride.

* * * * *